(12) United States Patent
Kim et al.

(10) Patent No.: US 11,824,260 B2
(45) Date of Patent: Nov. 21, 2023

(54) ELECTRONIC DEVICE COMPRISING ANTENNA

(71) Applicant: Samsung Electronics Co., Ltd., Gyeonggi-do (KR)

(72) Inventors: Sewoong Kim, Gyeonggi-do (KR); Chaeup Yoo, Gyeonggi-do (KR); Sumin Yun, Gyeonggi-do (KR); Woosuk Kang, Gyeonggi-do (KR); Inyoung Lee, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 454 days.

(21) Appl. No.: 16/972,111

(22) PCT Filed: Jun. 5, 2019

(86) PCT No.: PCT/KR2019/006825
§ 371 (c)(1),
(2) Date: Dec. 4, 2020

(87) PCT Pub. No.: WO2019/235860
PCT Pub. Date: Dec. 12, 2019

(65) Prior Publication Data
US 2021/0226326 A1 Jul. 22, 2021

(30) Foreign Application Priority Data
Jun. 5, 2018 (KR) .................. 10-2018-0064702

(51) Int. Cl.
*H01Q 1/38* (2006.01)
*H01Q 1/24* (2006.01)
(Continued)

(52) U.S. Cl.
CPC ................. *H01Q 1/38* (2013.01); *H01Q 1/24* (2013.01); *H05K 1/02* (2013.01); *H05K 1/0243* (2013.01);
(Continued)

(58) Field of Classification Search
CPC .......... H01Q 1/38; H01Q 1/24; H05K 5/0086; H05K 5/0017; H05K 1/0243;
(Continued)

(56) References Cited

U.S. PATENT DOCUMENTS 9,356,661 B2 5/2016 Samardzija et al.
9,685,690 B2 6/2017 Samardzija et al.
(Continued)

FOREIGN PATENT DOCUMENTS

KR 10-1677414 B1 11/2016
KR 10-2017-0020139 A 2/2017
(Continued)

*Primary Examiner* — Hai V Tran
(74) *Attorney, Agent, or Firm* — Cha & Reiter, LLC

(57) ABSTRACT

According to an embodiment, an electronic device may include a display including a first conductive plate, a printed circuit board interposed between a rear surface of housing and the display and including a second conductive plate, a first conductive pattern and a second conductive pattern that are interposed between the display and the printed circuit board, a wireless communication circuit electrically connected to the first conductive pattern and transmitting or receiving an RF signal of a first frequency or an RF signal of a second frequency, and at least one processor electrically connected to the wireless communication circuit. Besides, various embodiments as understood from the specification are also possible.

15 Claims, 15 Drawing Sheets

(51) Int. Cl.
  *H05K 1/02* (2006.01)
  *H05K 5/00* (2006.01)
  *H05K 7/14* (2006.01)
(52) U.S. Cl.
  CPC ............. H05K 5/00 (2013.01); H05K 5/0017 (2013.01); H05K 5/0086 (2013.01); H05K 7/14 (2013.01); H05K 7/1427 (2013.01); *H05K 2201/10037* (2013.01)
(58) Field of Classification Search
  CPC ....... H05K 7/1427; H05K 2201/10037; H05K 1/02; H05K 5/00; H05K 7/14
  USPC ........................................................ 343/720
  See application file for complete search history.

(56) References Cited

U.S. PATENT DOCUMENTS

| | | | |
|---|---|---|---|
| 10,135,152 B2 | 11/2018 | Ito | |
| 2008/0106478 A1* | 5/2008 | Hill | H01Q 1/38 |
| | | | 343/702 |
| 2012/0194393 A1* | 8/2012 | Uttermann | H01Q 1/526 |
| | | | 343/702 |
| 2015/0029060 A1 | 1/2015 | Jeon et al. | |
| 2015/0311960 A1* | 10/2015 | Samardzija | H01Q 1/273 |
| | | | 455/90.3 |
| 2016/0124396 A1 | 5/2016 | Choi et al. | |
| 2016/0218414 A1 | 7/2016 | Samardzija et al. | |
| 2017/0045916 A1 | 2/2017 | Kim et al. | |
| 2017/0244151 A1 | 8/2017 | Han et al. | |
| 2017/0309988 A1 | 10/2017 | Samardzija et al. | |
| 2017/0317425 A1 | 11/2017 | Ito | |
| 2018/0062249 A1 | 3/2018 | Sung et al. | |

FOREIGN PATENT DOCUMENTS

| | | | |
|---|---|---|---|
| KR | 10-2017-0098401 A | 8/2017 | |
| KR | 10-2018-0024336 A | 3/2018 | |

* cited by examiner

ELECTRONIC DEVICE COMPRISING ANTENNA

CROSS-REFERENCE TO RELATED APPLICATION(S)

This application is a National Phase Entry of PCT International Application No. PCT/KR2019/006825, which was filed on Jun. 5, 2019 and claims priority to Korean Patent Application No. 10-2018-0064702, which was filed on Jun. 5, 2018, the contents of which are incorporated herein by reference.

TECHNICAL FIELD

Embodiments disclosed in this specification relates to an antenna technology utilizing a display included in an electronic device.

BACKGROUND ART

The sizes of portable electronic devices have been recently miniaturized. At the same time, displays having the largest size have been mounted for aesthetics. Such the electronic devices are equipped with an antenna and may communicate with a network using the mounted antenna.

DISCLOSURE

Technical Problem

When a display is positioned close to an antenna, the performance of the antenna may deteriorate. Accordingly, a separate space for mounting the antenna may be required to mount the antenna while the antenna avoids the display. Besides, when the display is included in an antenna structure, other separate configurations (e.g., a transparent electrode layer) may need to be installed on the display. Such other configurations may reduce the visibility of the display or may increase the manufacturing cost.

Various embodiments disclosed in this specification may provide an electronic device including an antenna formed using at least part of the display.

Technical Solution

According to an embodiment disclosed in this specification, an electronic device may include a housing including a first surface, a second surface facing away from the first surface, and a side surface surrounding a space between the first surface and the second surface, a display exposed through a part of the first surface and including a first conductive plate, a printed circuit board including a second conductive plate interposed between the display and the second surface within the housing and electrically connected to the first conductive plate, a first conductive pattern interposed between the display and the printed circuit board, a second conductive pattern interposed between the display and the printed circuit board to be adjacent to the first conductive pattern and electrically connected to the second conductive plate, a wireless communication circuit electrically connected to the first conductive pattern and transmitting or receiving an RF signal of a first frequency or an RF signal of a second frequency, and at least one processor electrically connected to the wireless communication circuit.

Furthermore, according to an embodiment disclosed in this specification, an electronic device may include a housing including a first surface facing in a first direction and a second surface facing in a second direction opposite to the first direction, a display disposed inside the housing and viewable through at least part of the first surface, a printed circuit board interposed between the display and the second surface inside the housing and including a second conductive plate, a conductive pattern positioned between the display and the printed circuit board, spaced from the first conductive plate, and positioned in a first region when viewed from above the display, a wireless communication circuit mounted on the printed circuit board, and electrically connected to the conductive pattern, and an electrical path connected between a first point of the first conductive plate and a second point of the second conductive plate. The display may include a first conductive plate. The first point and the second point may be in a second region outside the first region when viewed from above the display.

Advantageous Effects

According to embodiments disclosed in the specification, an antenna supporting two or more types of communication schemes may be implemented using an electronic device including a display. For example, the antenna may refer to an antenna supporting GPS communication and Bluetooth communication.

According to embodiments disclosed in the specification, the antenna may be formed using at least part of the configurations included in the display, thereby reducing a space for arranging the antenna.

Besides, a variety of effects directly or indirectly understood through the specification may be provided.

MODE FOR INVENTION

Hereinafter, various embodiments of the disclosure will be described with reference to accompanying drawings. However, it should be understood that this is not intended to limit the disclosure to specific implementation forms and includes various modifications, equivalents, and/or alternatives of embodiments of the disclosure.

Figure 1A:
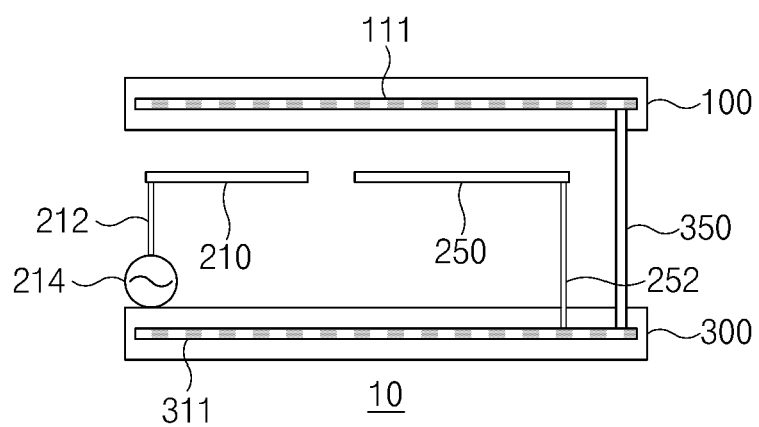
FIG. 1A illustrates a structure of an antenna according to an embodiment.
Figure 1B:
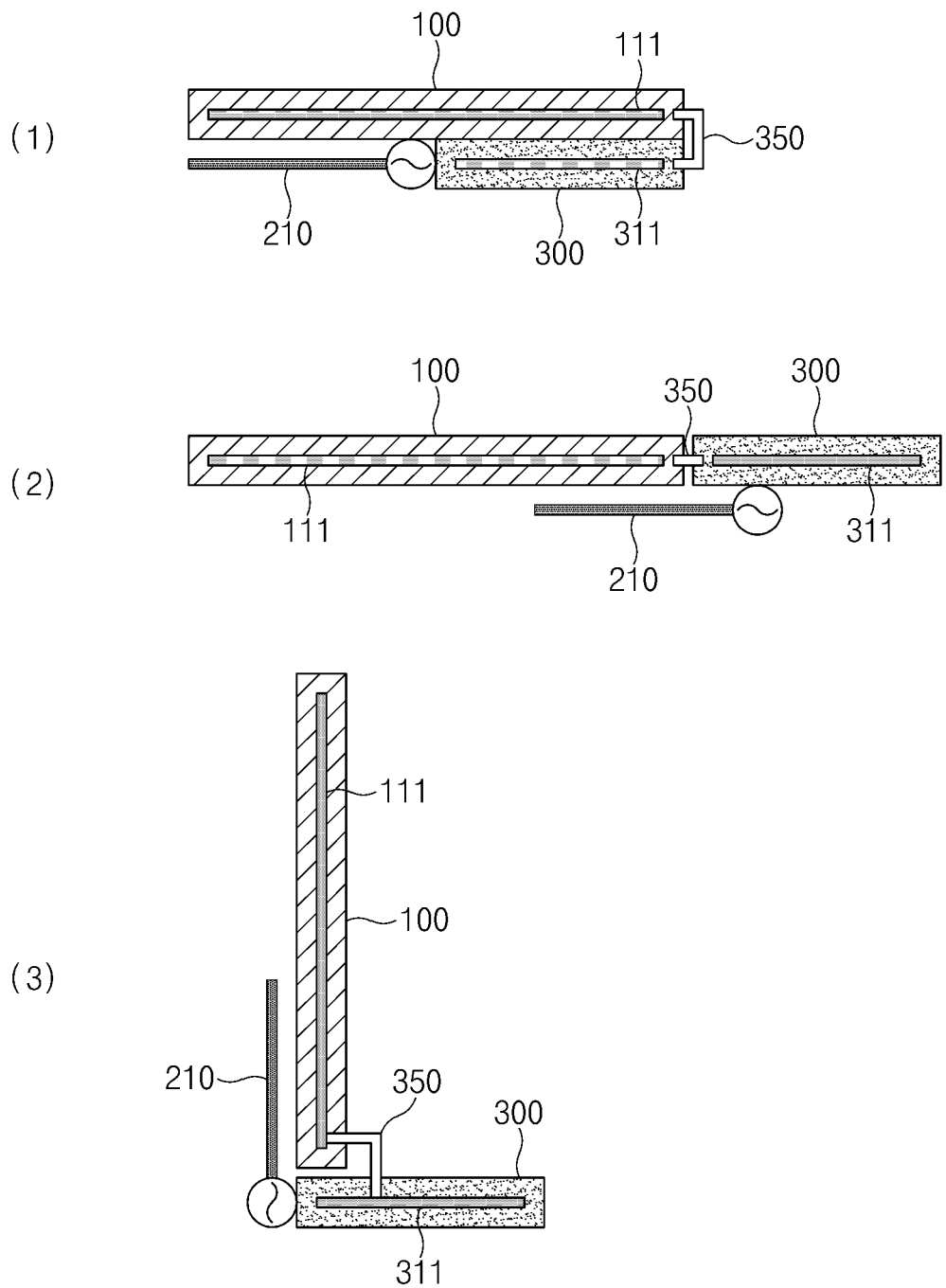
FIG. 1B is a diagram illustrating an arrangement structure of configurations of an antenna according to various embodiments.

FIG. 1A illustrates a structure of an antenna according to an embodiment. FIG. 1B is a diagram illustrating an arrangement structure of configurations of an antenna according to various embodiments.

Referring to FIG. 1A, an antenna 10 according to an embodiment may include a display 100, a first conductive pattern 210, a second conductive pattern 250, a printed circuit board 300, and a connection member 350.

In an embodiment, the display 100 may include a plurality of conductive layers. For example, the display 100 may include at least one conductive layer of a shielding layer (e.g., a copper sheet), a touch screen panel (TSP) layer, or a thin film transistor (TFT) layer. Hereinafter, at least one conductive layer included in the display 100 may be referred to as a first conductive plate 111.

The antenna 10 may receive or transmit a signal in a specified frequency band through coupling between the first conductive plate 111 of the display 100, the first conductive pattern 210, and the second conductive pattern 250.

In an embodiment, the first conductive pattern 210 may be interposed between the first conductive plate 111 and the printed circuit board 300. The first conductive pattern 210 may be disposed adjacent to the display 100 for coupling with the first conductive plate 111.

According to an embodiment, the second conductive pattern 250 may be disposed adjacent to the first conductive pattern 210 between the display 100 and the printed circuit board 300.

In an embodiment, the printed circuit board 300 may include a second conductive plate 311. For example, the second conductive plate may operate as a ground. The second conductive plate 311 may be electrically connected to the second conductive pattern 250. For example, the second conductive pattern 250 may be electrically connected to at least one ground area of the printed circuit board 300 through a ground line 252.

Figure 2A:
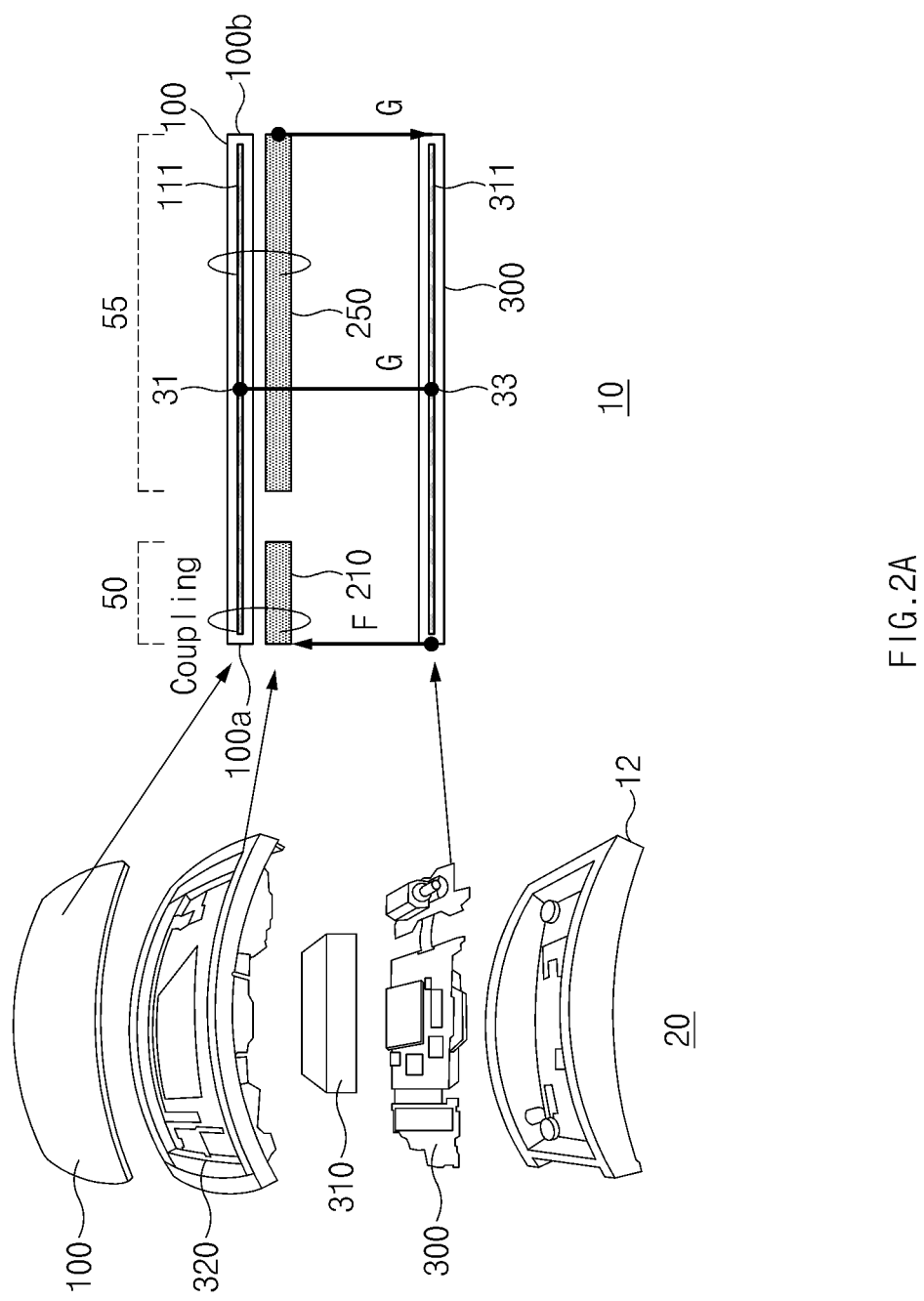
FIG. 2A illustrates a perspective view of an electronic device including an antenna, according to an embodiment.

In the embodiment of FIG. 2A, a wireless communication circuit may feed the first conductive pattern 210. For example, the wireless communication circuit may be connected to a feeding part 214. The feeding part 214 may be electrically connected to the first conductive pattern 210 through a feeding line 212. The wireless communication circuit may feed the first conductive pattern 210 through the feeding part 214 and the feeding line 212. When the first conductive pattern 210 is fed, the first conductive plate 111 may be indirectly fed through a coupling with the first conductive pattern 210. When the first conductive pattern 210 is fed, the second conductive pattern 250 may be indirectly fed through the coupling with the first conductive pattern 210 and the first conductive plate 111.

In an embodiment, at least one processor of an electronic device may allow the wireless communication circuit to transmit and receive the RF signal of the first frequency and the RF signal of the second frequency, using the first conductive plate 111, the first conductive pattern 210, and the second conductive pattern 250.

For example, the wireless communication circuit may transmit and receive the RF signal of the first frequency and the RF signal of the second frequency, based on the coupling between the first conductive pattern 210 and at least part of the first conductive plate 111, and the coupling between the second conductive pattern 250 and at least part of the first conductive plate 111. At least part of the first conductive plate 111 may function as the radiator of the antenna 10. For example, the first frequency may include 1.5 GHz, and the second frequency may include 2.4 GHz. The wireless communication circuit may support GPS communication or Bluetooth communication, using the antenna 10.

In various embodiments, the arrangement shape of the first conductive pattern 210, the second conductive pattern 250, the first conductive plate 111, the second conductive plate 311, and the connection member 350 of the antenna 10 shown in FIG. 1A is exemplary, and is not limited thereto.

Referring to FIG. 1B, the configurations included in the antenna 10 according to various embodiments may have various arrangement shapes. For example, the antenna 10 may be designed in various arrangement shapes, depending on the type of an electronic device on which the antenna 10 is mounted, and the type (e.g., a display or a printed circuit board) of parts included in the configuration of the antenna 10. The second conductive pattern 250 is not shown. However, for example, the first conductive pattern 210, the first conductive plate 111, and the printed circuit board 300 may be disposed on various positions with each other to be electrically connected.

According to various embodiments, referring to arrangement shape (1), arrangement shape (2), and arrangement shape (3), the display 100 and the first conductive pattern 210 may be disposed close to each other such that the coupling is possible. For example, referring to arrangement shape (1), the display 100 and the printed circuit board 300 may be disposed close to each other to occupy a space smaller than the antenna 10 of FIG. 1A. Referring to arrangement shape (2), the display 100 and the printed circuit board 300 may be arranged in parallel. Referring to arrangement shape (3), the display 100 and the printed circuit board 300 may be arranged orthogonally.

Figure 2B:
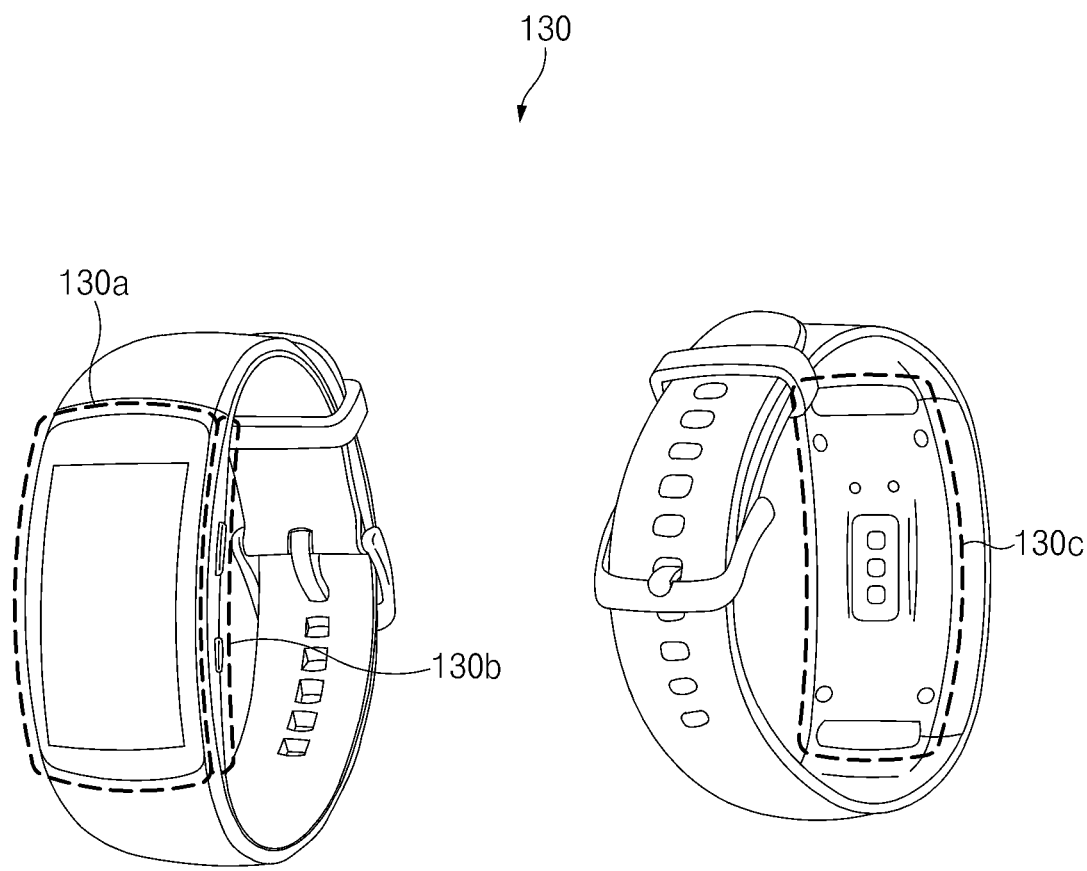
FIG. 2B illustrates an appearance of an electronic device according to an embodiment.

FIG. 2A illustrates a perspective view of an electronic device including an antenna, according to an embodiment. FIG. 2B illustrates an appearance of an electronic device according to an embodiment.

Figure 13:
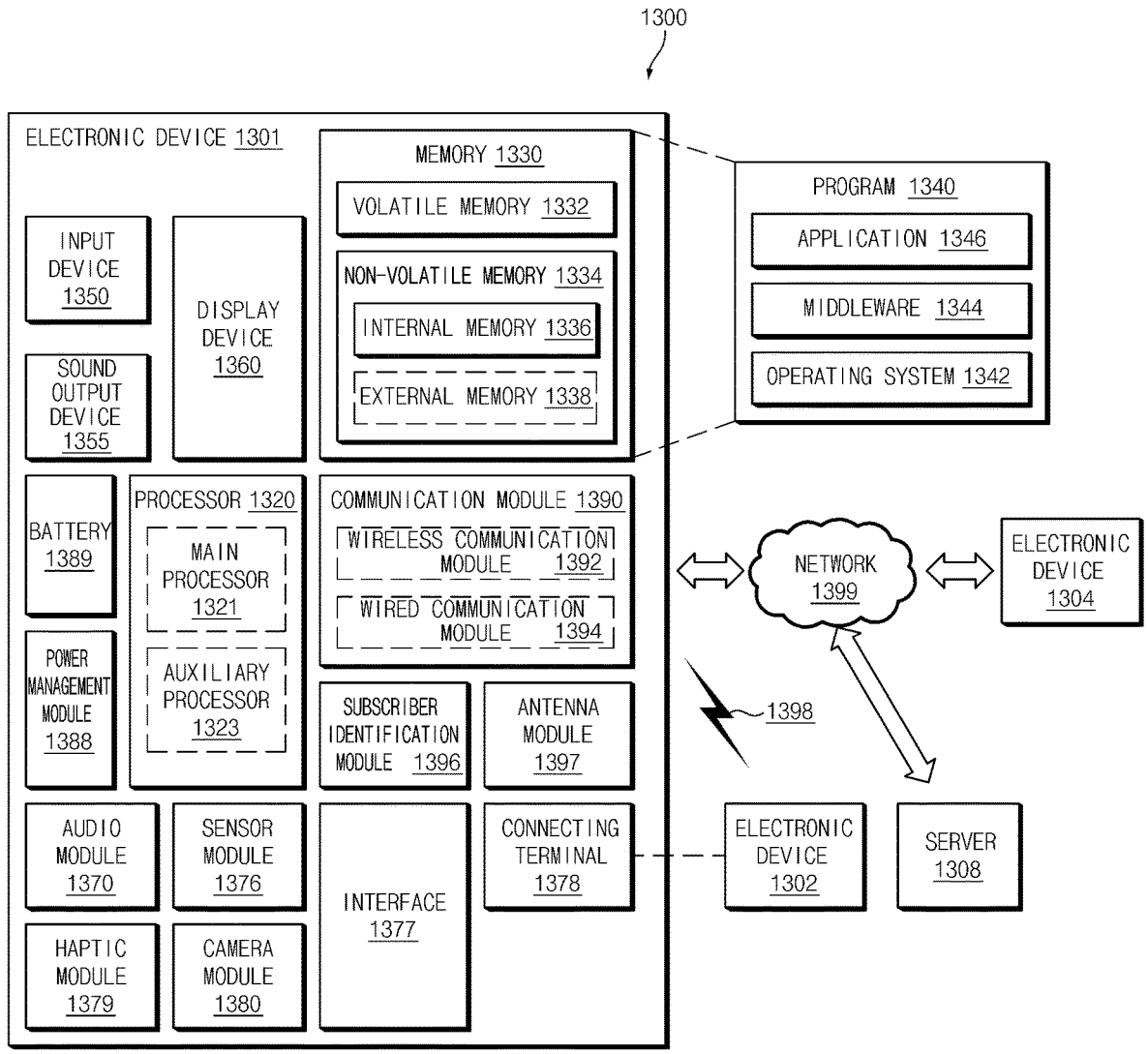
FIG. 13 illustrates an electronic device in a network environment according to various embodiments; and With regard to description of drawings, the same or similar components will be marked by the same or similar reference signs.

In an embodiment, the antenna 10 may be mounted in an electronic device 20 (e.g., an electronic device 1301 of FIG. 13). For example, the electronic device 20 may be referred to as a wearable device including the display 100. For example, the electronic device may be referred to as various types of wearable devices including a watch type (e.g., a smart watch), a band type (e.g., a smart band), a glasses type (e.g., smart glasses), or a ring type. Referring to FIG. 2A, a watch-type wearable device and a perspective view thereof are illustrated as an example.

Referring to FIG. 2A, the antenna 10 (e.g., the antenna 10 in FIG. 1A) according to an embodiment may include the first conductive pattern 210 (e.g., the first conductive pattern 210 in FIG. 1A), and the second conductive pattern 250 (e.g., the second conductive pattern 250 in FIG. 1A), the display 100 (e.g., the display 100 in FIG. 1A), the printed circuit board 300 (e.g., the printed circuit board 300 in FIG. 1A), and a connection member (not shown) (e.g., the connection member 350 of FIG. 1A). The display 100 may include the first conductive plate 111 (e.g., the first conductive plate 111 of FIG. 1A). The printed circuit board 300 may include the second conductive plate 311 (e.g., the second conductive plate 311 of FIG. 1B). The antenna 10 may receive or transmit a signal in a specified frequency band through the coupling between the first conductive pattern 210 and the second conductive pattern 250 and the first conductive plate 111 of the display 100.

Referring to FIG. 2B, an example of the shape of the housing 130 of the electronic device 20 is illustrated. For example, the housing 130 may include a first surface 130a (e.g., a front surface) facing a first direction, a second surface 130c facing a second direction opposite to the first direction (e.g., a rear surface), and a side surface 130b surrounding the space between the first surface 130a and the second surface 130c. In another embodiment (not illustrated), the housing 130 may be referred to as a "structure" that forms a part of the first surface 130a, the second surface 130c, and the side surface 130b. The shape of the housing 130 is not limited to the shape shown in FIG. 2B and may have various shapes. The first conductive pattern 210, the second conductive pattern 250, the display 100, the printed circuit board 300, and the connection member (not illustrated) may be disposed inside the housing 130.

In various embodiments, the housing 130 may be formed by at least part of the components included in the electronic device 20. For example, referring to FIG. 2A, a rear cover 12 is illustrated. The rear cover 12 may form at least part of the second surface 130c and the side surface 130b of the housing 130 described above in an example. For example, as illustrated in FIG. 2A, at least part of a support member 320 may form the first surface 130a.

For example, at least part of the display 100 may be exposed through the first surface 130a. When being worn, at least part of the second surface 130c of the housing 130 may contact a user. For example, the second surface 130c of the watch-type wearable device may contact the user's wrist. For example, the electronic device 20 may be worn in a state where at least part of the second surface 130c contacts the user's body. It is difficult for the antenna signal inside the electronic device 20 to be radiated through a portion contacting the user's body. For example, most of the front surface 130a of the housing 130 may be occupied by the display 100, and the rear surface 130c may contact the user's body. In this case, the electronic device 20 may transmit and receive an antenna signal, using the conductive layer included in the display 100 as a radiator. In an embodiment, the printed circuit board 300 may include the second conductive plate 311. The second conductive plate 311 may be referred to as a ground region included in the printed circuit board 300. The second conductive plate 211 may be electrically connected to the first conductive plate 111 included in the display 100, and may be electrically connected to the second conductive pattern 210 (e.g., the second conductive pattern 210 in FIG. 1A). For example, the printed circuit board 300 may be interposed between the display 100 and the second surface 12c of the housing.

In an embodiment, the electronic device 20 may include the support member 320 interposed between the display 100 and the printed circuit board 300. The support member 320 may support the display 100 and the printed circuit board 300 of the electronic device 20. For example, at least part of the support member 320 may be formed of a non-conductive material.

In an embodiment, the first conductive pattern 210 and the second conductive pattern 250 may be disposed on the support member 320. For example, the first conductive pattern 210 may be positioned between the display 100 and the printed circuit board 300. When viewed from above the display 100, the first conductive pattern 210 may overlap with the first conductive plate 111 included in the display 100 in a first region 50.

For example, the first conductive pattern 210 and the second conductive pattern 250 may be plated or printed on the support member 320. For example, each of the first conductive pattern 210 and the second conductive pattern 250 may be referred to as a laser direct structuring (LDS) pattern formed on the support member 320. For another example, the first conductive pattern 210 and the second conductive pattern 250 may be referred to as a film of a metal material or a metal plate.

In various embodiments, the first conductive pattern 210 may be disposed in parallel with the display 100. For example, the first conductive pattern 210 may be parallel to the first conductive plate 111 included in the display 100.

In an embodiment, the electronic device 20 may include an electrical path connected between a first point 31 of the first conductive plate 111 of the display 100 and a second point 33 of the second conductive plate 311 of the printed circuit board 300. When viewed from above the display 100, the first point 31 and the second point 33 may be in a second region 55 outside the first region 50. For example, the electrical path may be connected by a connection member (e.g., the connection member 350 of FIG. 1A).

In various embodiments, the display 100 may include a first edge 100a and a second edge 100b parallel to the first edge 100a. The first region 50 may be closer to the first edge 100a than the second edge 100b; the second region 55 may be closer to the second edge 100b than the first edge 100a.

In various embodiments, the electronic device 20 may include a battery 310. For example, the battery 310 may be interposed between the printed circuit board 300 and the support member 320. For another example, the battery 310 may be disposed to overlap with at least part of the first conductive pattern 210 or at least part of the second conductive pattern 250.

According to one embodiment, when the battery 310 is disposed to overlap with the first conductive pattern 210, the electromagnetic field formed between the first conductive pattern 210 and the display 100 by the battery 310 including a metallic material is formed inside the electronic device 20, and thus it may be difficult to radiate a signal to the outside. Accordingly, the radiating performance of the antenna 10 may deteriorate. However, the second conductive pattern 250 is positioned adjacent to the first conductive pattern 210 and the display 100, and thus the amount of coupling between the first conductive pattern 210 and the display 100 is increased. Accordingly, the electromagnetic field formed between the first conductive pattern 210 and the display 100 may be exposed to the outside, thereby improving the radiation performance of the antenna 10. Hereinafter, reference numerals in FIGS. 1A, 2A, and 2B may be referenced for the same or similar configuration.

Figure 3:
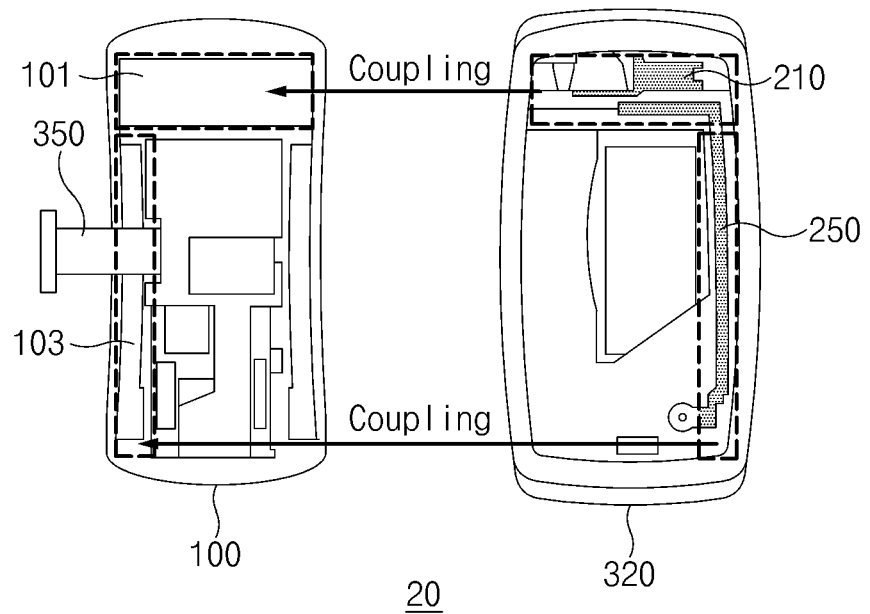
FIG. 3 is a diagram for describing a feeding structure of an antenna according to an exemplary embodiment.

FIG. 3 is a diagram for describing a feeding structure of an antenna according to an exemplary embodiment.

Referring to FIG. 3, the rear surface of the display 100 and one surface of the support member 320 are illustrated. An example is illustrated as the first conductive pattern 210 and the second conductive pattern 250 formed on one surface of the support member 320. An example is illustrated as the connection member 350 (e.g., the connection member 350 of FIG. 1A).

In an embodiment, when the first conductive pattern 210 is fed, a first region 101 of the display 100 may be indirectly fed through the coupling with the first conductive pattern 210.

In an embodiment, the second conductive pattern 250 may be indirectly fed through the coupling with the first conductive pattern 210 and the display 100. For example, a second region 103 of the display 100 may be indirectly fed through the coupling with the second conductive pattern 250.

For example, the conductive plate included in the display 100 may be coupled to the first conductive pattern 210 and the second conductive pattern 250. At least some regions of the conductive plate included in the display 100 may function as the radiator of the antenna 10. According to an embodiment, the electronic device 20 may receive or transmit RF signals in at least '2' or more frequency bands through the conductive plate included in the display 100.

Figure 4:
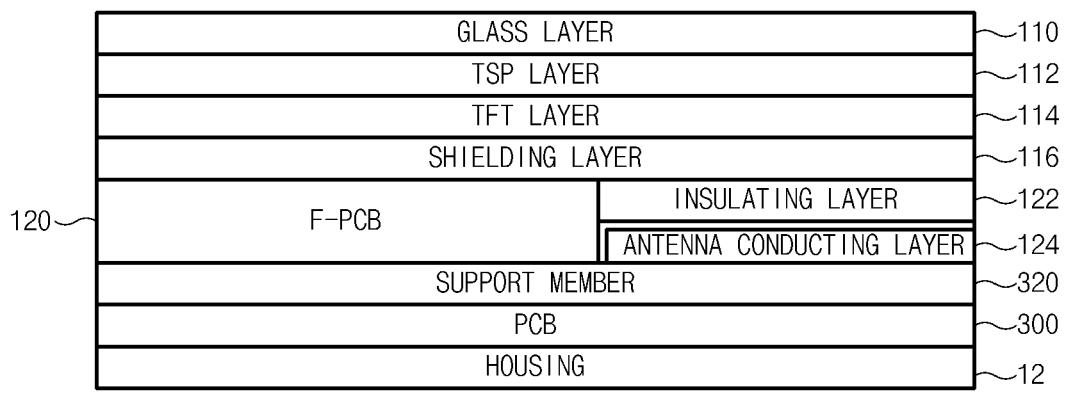
FIG. 4 is a schematic side view of an electronic device according to an embodiment.

FIG. 4 is a schematic side view of the electronic device 20 according to an embodiment.

Referring to FIG. 4, the display 100 according to various embodiments may include a plurality of layers. For example, the display 100 may include a glass layer 110, a TSP layer 112, a TFT layer 114, a shielding layer 116 (e.g., a copper sheet), and an FPCB layer 120 on which a display driving integrated circuit is disposed. For example, at least one of the TSP layer 112, the TFT layer 114, and the shielding layer 116 may be referred to as the first conductive plate 111 described above in FIG. 1A.

For example, at least one conductive plate among the TSP layer 112, the TFT layer 114, and the shielding layer 116 may be electrically connected to the ground region of the printed circuit board 300. Hereinafter, the at least one conductive plate electrically connected to the ground region may be described as the first conductive plate. For example, the first conductive plate is described as a single conductive plate, but is exemplary. The first conductive plate may include one or more conductive plates included in the display 100. The first conductive plate may be coupled with the first conductive pattern 210 and the second conductive pattern 250 which are disposed on the support member 320. The display 100 may operate as the radiator of the antenna 10 by means of the first conductive plate.

In various embodiments, an insulating layer 122 and an antenna conducting layer 124 may be interposed between the display 100 and the support member 320. A feeding line for feeding the first conductive pattern may be disposed on the antenna conducting layer 124.

Figure 5:
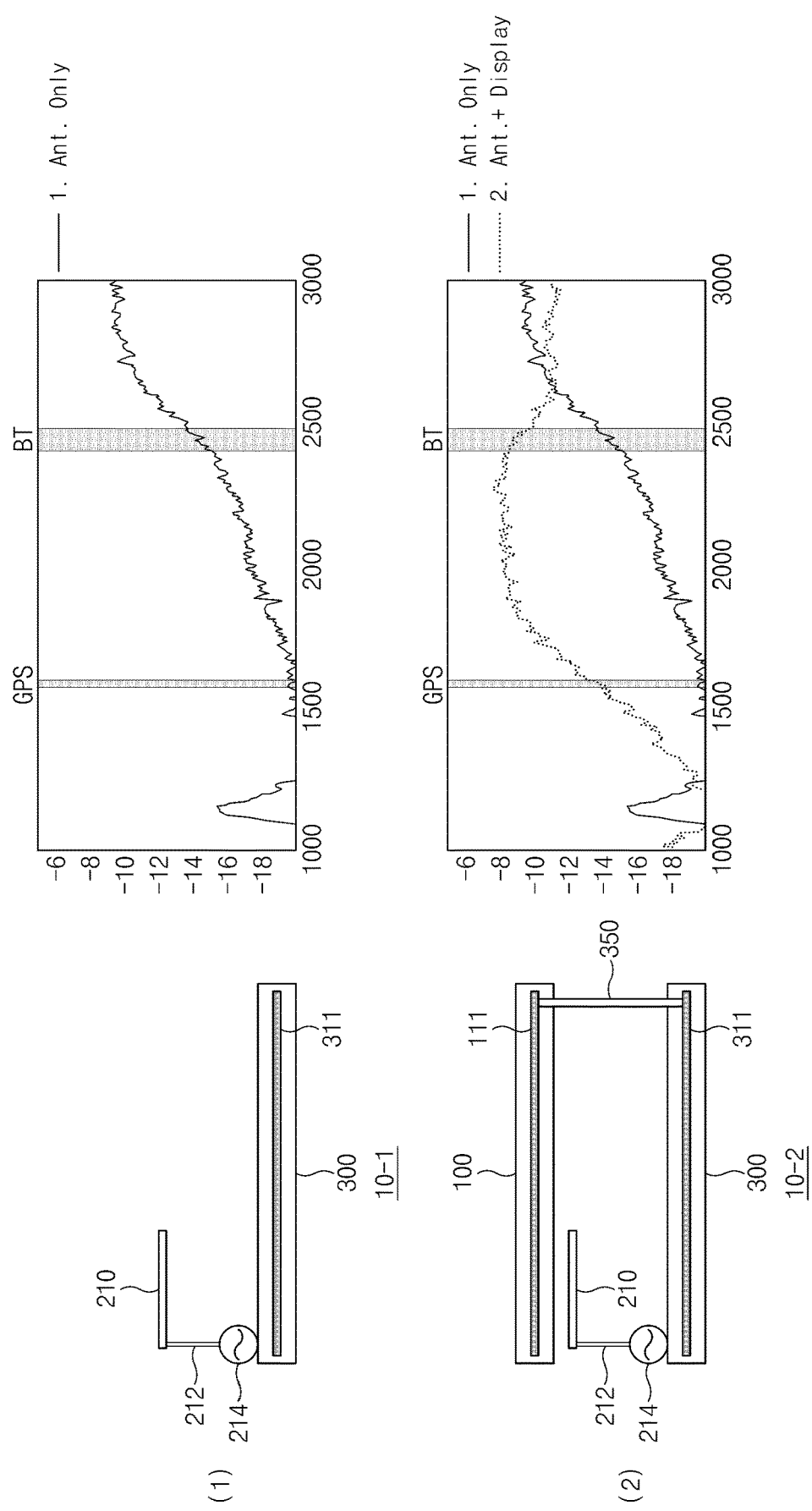
FIGS. 5 and 6 are graphs illustrating the efficiency of an antenna according to various embodiments.
Figure 6:
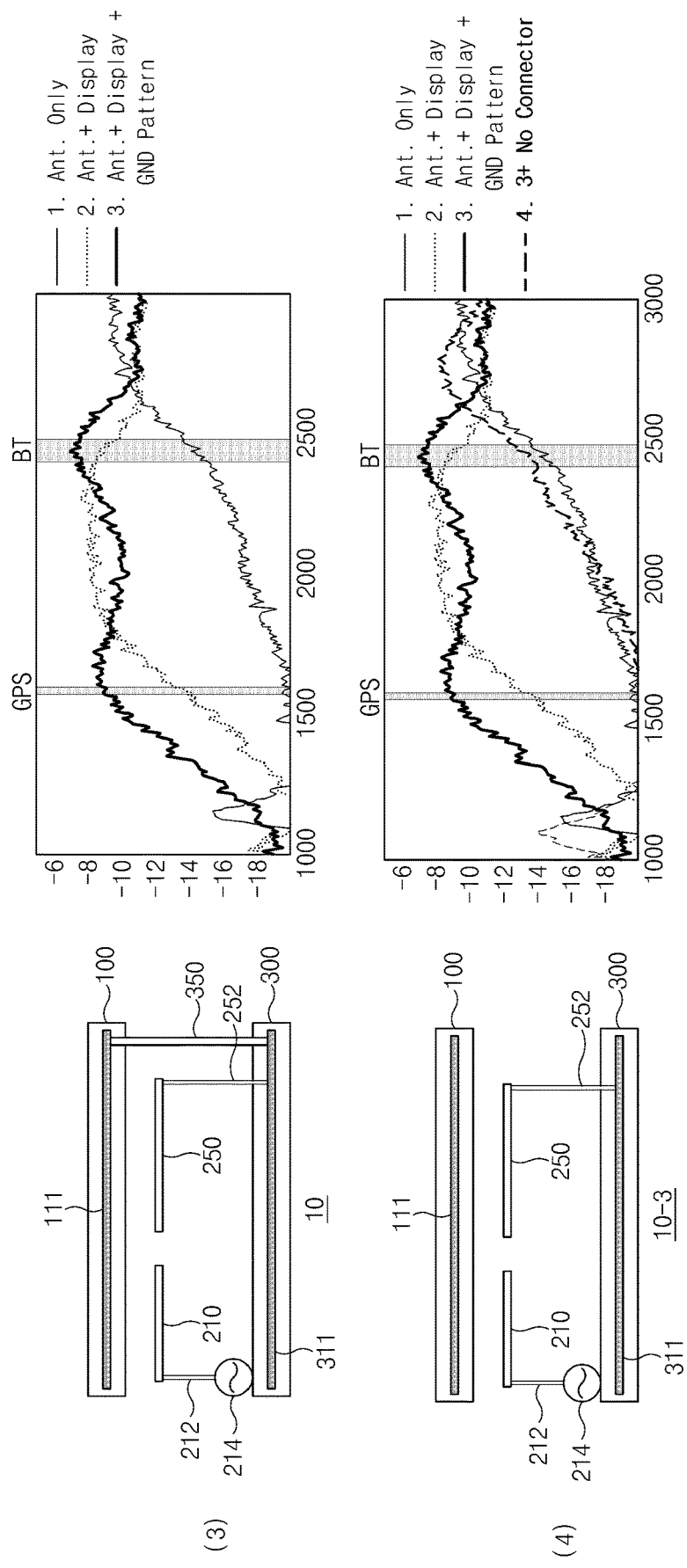

FIGS. 5 and 6 are graphs illustrating the efficiency of an antenna according to various embodiments.

In various embodiments, the electronic device 20 may transmit and receive RF signals for Bluetooth communication and RF signals for GPS communication, through the antenna 10 (e.g., the antenna 10 of FIG. 1A), an antenna 10-1, an antenna 10-2, and an antenna 10-3. Hereinafter, referring to FIGS. 5 and 6, graphs illustrating antenna efficiency measured depending on the components of the antenna are illustrated.

Referring to graph (1) of FIG. 5, when the antenna 10-1 is formed of the first conductive pattern 210 and the printed circuit board 300, the electronic device 20 may not support GPS communication. In addition, it may be predicted that the performance of the Bluetooth communication of the electronic device 20 is low.

Referring to graph (2) of FIG. 5, the antenna 10-2 may be formed of the first conductive pattern 210, the connection member 350, the printed circuit board 300, and a display 100 electrically connected to the ground region of the printed circuit board 300 through the connection member 350. In this case, as compared to the case of graph (1), the electronic device 20 may support GPS communication and Bluetooth communication of the improved performance.

Referring to graph (3) of FIG. 6, the antenna 10 may be formed of the first conductive pattern 210, the second conductive pattern 250 electrically connected to the ground region of the printed circuit board 300, and the display 100 electrically connected to the ground region through the connection member 350. In this case, double resonance may occur in about 1.5 GHz band and about 2.4 GHz band. The electronic device 20 may support GPS communication and Bluetooth communication of the improved performance.

Referring to graph (4) of FIG. 6, the antenna 10-3 may be formed of the first conductive pattern 210, the display 100, and the second conductive pattern 250 electrically connected to the ground region of the printed circuit board 300. In this case, as in the case of graph (1), the electronic device 20 may not support GPS communication; the electronic device 20 may support Bluetooth communication having performance lower than the antenna 10 of graph (4) below. Through graph (4), it may be seen that double resonance does not occur when the first conductive plate of the display 100 is not electrically connected to the ground region of the printed circuit board 300. The antenna 10 may generate a specified double resonance through the display 100 connected to the ground structure through the connection member 350.

Through FIGS. 5 and 6, it may be seen that double resonance occurs, by adding the second conductive pattern 350 electrically connected to the ground region to the antenna 10.

Figure 7:
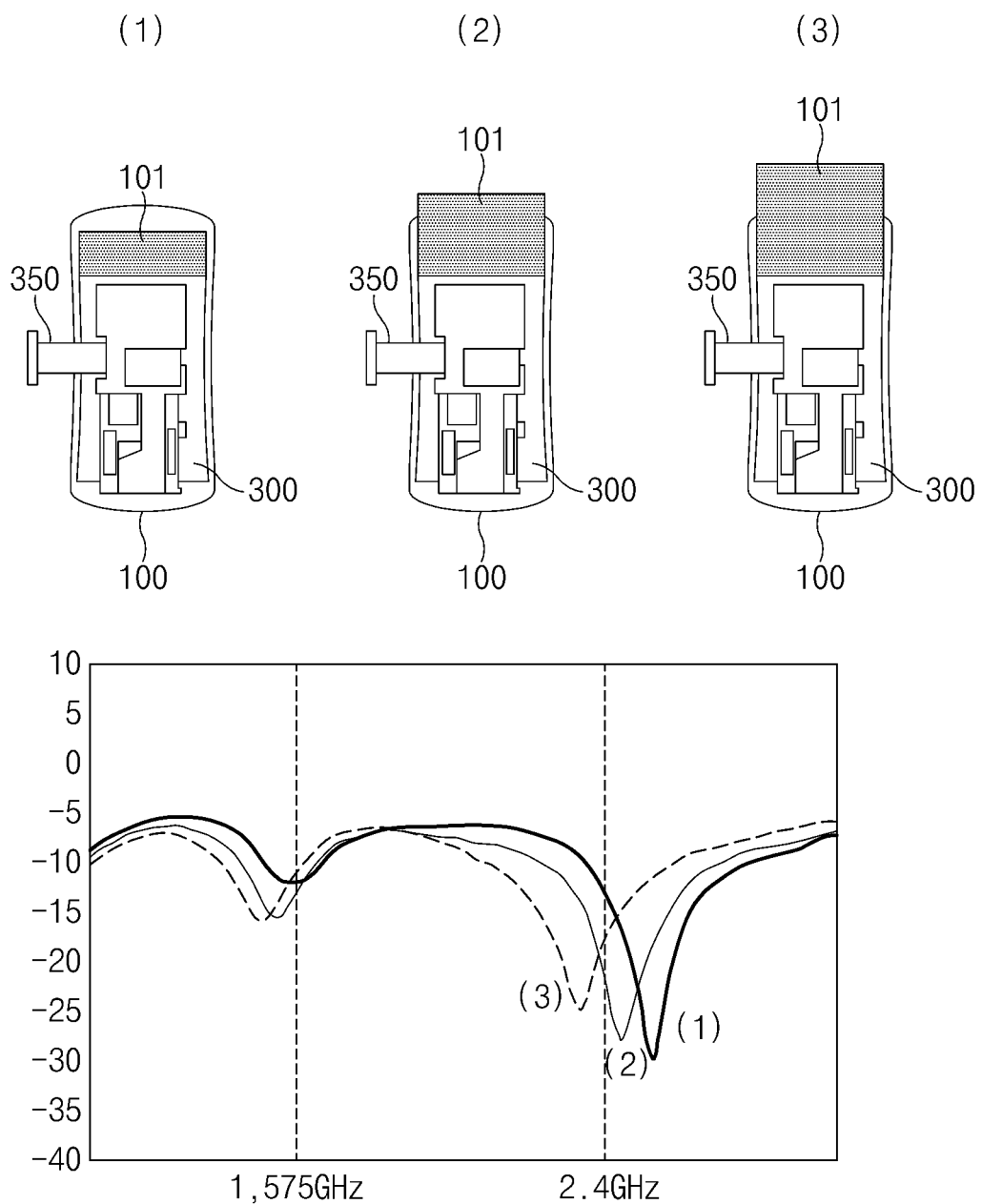
FIG. 7 illustrates a return loss graph according to an electrical length of a ground formed on a display of an antenna according to various embodiments.
Figure 8:
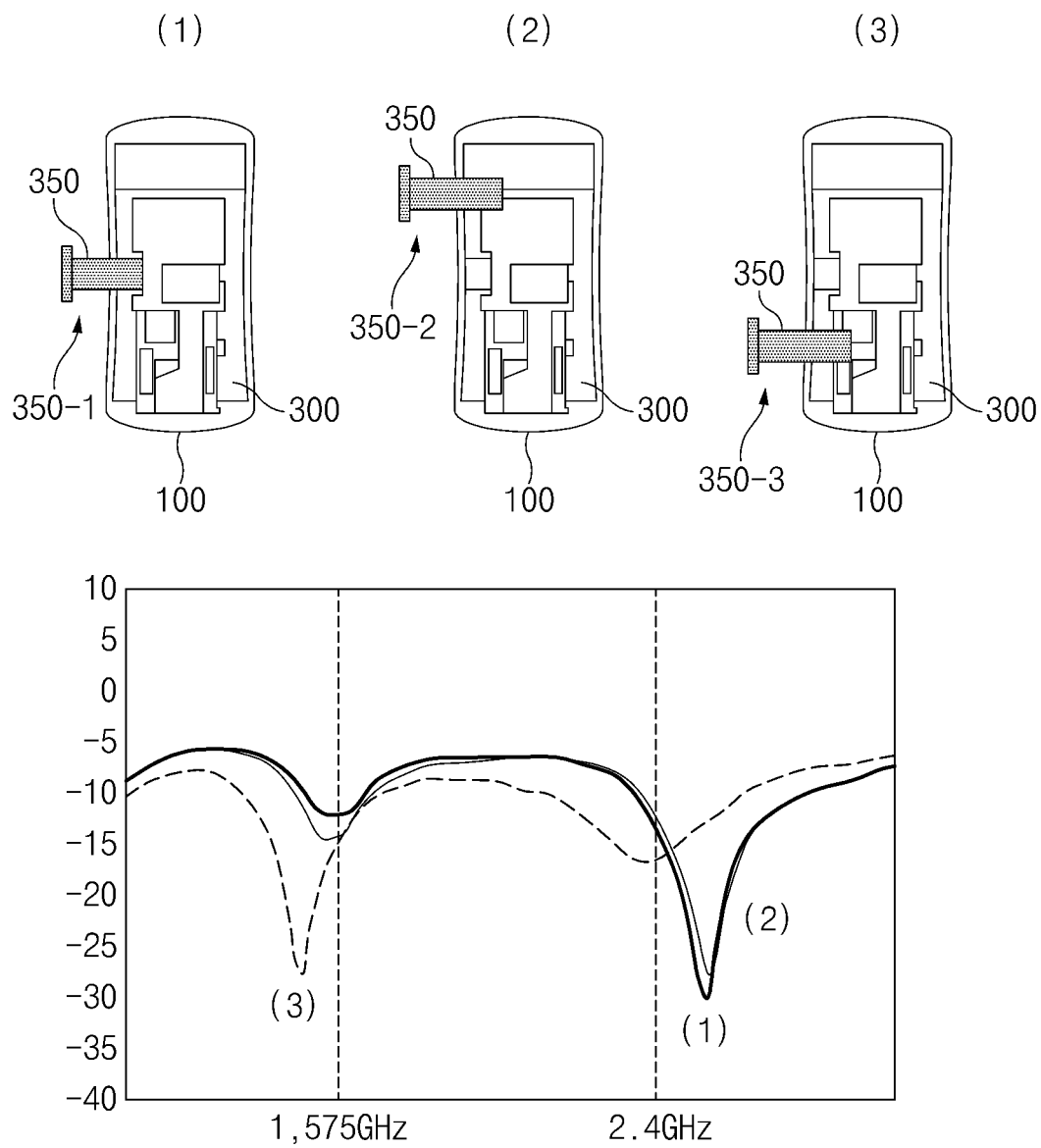
FIG. 8 illustrates a return loss graph according to a location of a connection member included in an antenna according to various embodiments.
Figure 9:
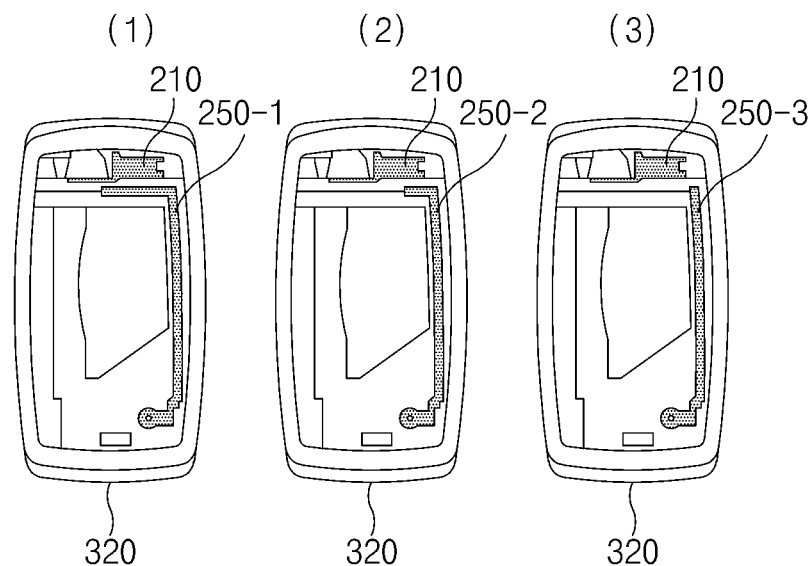
FIG. 9 illustrates a return loss graph according to the length of a conductive pattern included in an antenna according to various embodiments.
Figure 9:
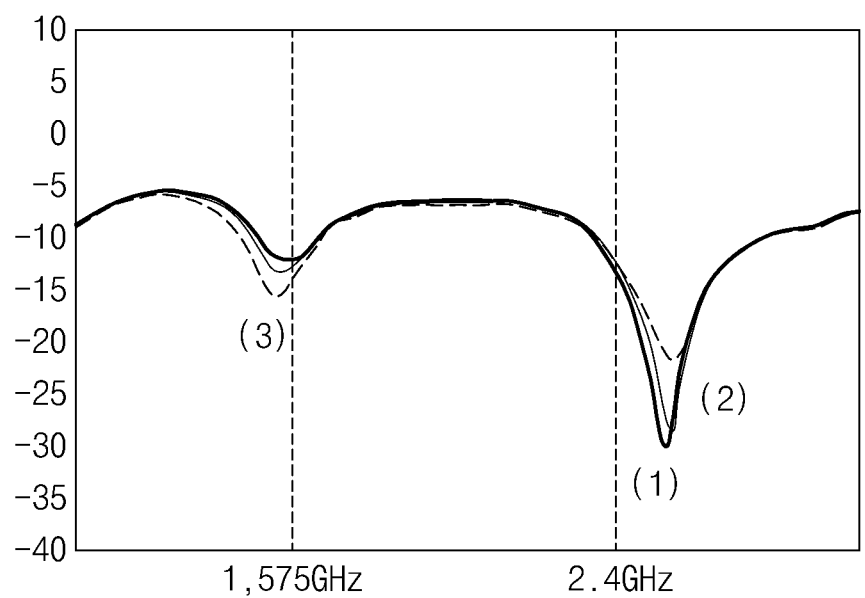

FIG. 7 illustrates a return loss graph according to an electrical length of a conductive plate (e.g., the first conductive plate 111 of FIG. 1A) included in the display 100 of an antenna according to various embodiments. FIG. 8 illustrates a return loss graph according to a location of a connection member included in an antenna according to various embodiments. FIG. 9 illustrates a return loss graph according to the length of a conductive pattern included in an antenna according to various embodiments. Hereinafter, through FIGS. 7 to 9, in the antenna 10 (e.g., the antenna 10 of FIG. 1A) according to an embodiment, return loss graphs according to the size of the display 100, the location of the connection member 350, and the length of the second conductive pattern 250, which are referenced as tuning elements for the frequency band are described. The return loss graph has been measured for the electronic device 10 equipped with the antenna 10. For example, the antenna 10 may resonate in a first frequency band (about 1.5 GHz) and a second frequency band (about 2.4 GHz).

Referring to FIG. 7, the rear surface of the display 100 is illustrated. The rear surface of the display 100 may correspond to the rear surface of the display 100 illustrated in FIG. 3. The size of the first region 101 indirectly fed by the first conductive pattern 210 may increase as a procedure proceeds from the first embodiment (1) to the third embodiment (3). For example, a conductive plate (e.g., the conductive plate 111 of FIG. 1A) that functions as a ground of the display 100 may function as the radiator of the antenna 10.

Referring to the return loss graph of FIG. 7, it may be seen that the resonance frequency decreases as the size of the first region 101 of the display 100 of the electronic device increases. As the size of the first region 101 included in the display 100 increases, the length of the electrical path of the RF signal may increase and the resonance frequency may decrease.

For example, as the size of the first region 101 is changed, the electrical length of the ground formed on the display 100 may be changed. As the procedure proceeds from the first embodiment (1) to the third embodiment (3), the electrical length of the ground may increase. The electrical length of the ground may be changed based on the size of the first region 101 of the display 100. For example, the size of the display 100 may be used as a tuning element of the antenna 10.

Referring to FIG. 8, the rear surface of the display 100 of the electronic device is illustrated. The rear surface of the display 100 may correspond to the rear surface of the display 100 illustrated in FIG. 3. A first location 350-1 of the connection member 350 in the first embodiment (1) may be positioned between a second location 350-2 and a third location 350-3; the second location 350-2 of the connection member 350 in the second embodiment (2) may be positioned adjacent to the first region 101; the third location 350-3 of the connection member 350 in the third embodiment (3) may be positioned farther from the first region 101 than the first embodiment (1).

Referring to the return loss graph of FIG. 8, the length of the electrical path of the RF signal formed on the display 100 may be changed depending on the location of the connection member 350. As the connection member 350 is positioned farther from the first region 101 coupled with the first conductive pattern 210, the resonance may be improved in about 1.5 GHz band, and may be reduced in about 2.4 GHz band. For example, the performance of GPS communication using 1.5 GHz band may be improved, and the performance of Bluetooth communication using 2.4 GHz band may be degraded.

Referring to FIG. 9, one surface of the support member 320 is illustrated. One surface of the support member 320 may correspond to one surface of the support member 320 illustrated in FIG. 3. As the procedure proceeds from the first embodiment (1) to the third embodiment (3), the length of the second conductive patterns 250-1, 250-2, and 250-3 may be shorter, and the amount of coupling between the first conductive pattern 210 and the second conductive patterns 250-1, 250-2, and 250-3 may be reduced. Referring to the return loss graph of FIG. 9, as the lengths of the second conductive patterns 250-1, 250-2, and 250-3 become longer, and the amount of coupling between the first conductive pattern 210 and the second conductive patterns 250-1, 250-2, and 250-3 increases, the performance of communication (e.g., Bluetooth communication) in about 2.4 GHz band is improved, and the performance of communication (e.g., the performance of GPS communication) in about 1.5 GHz band may be deteriorated.

Figure 10:
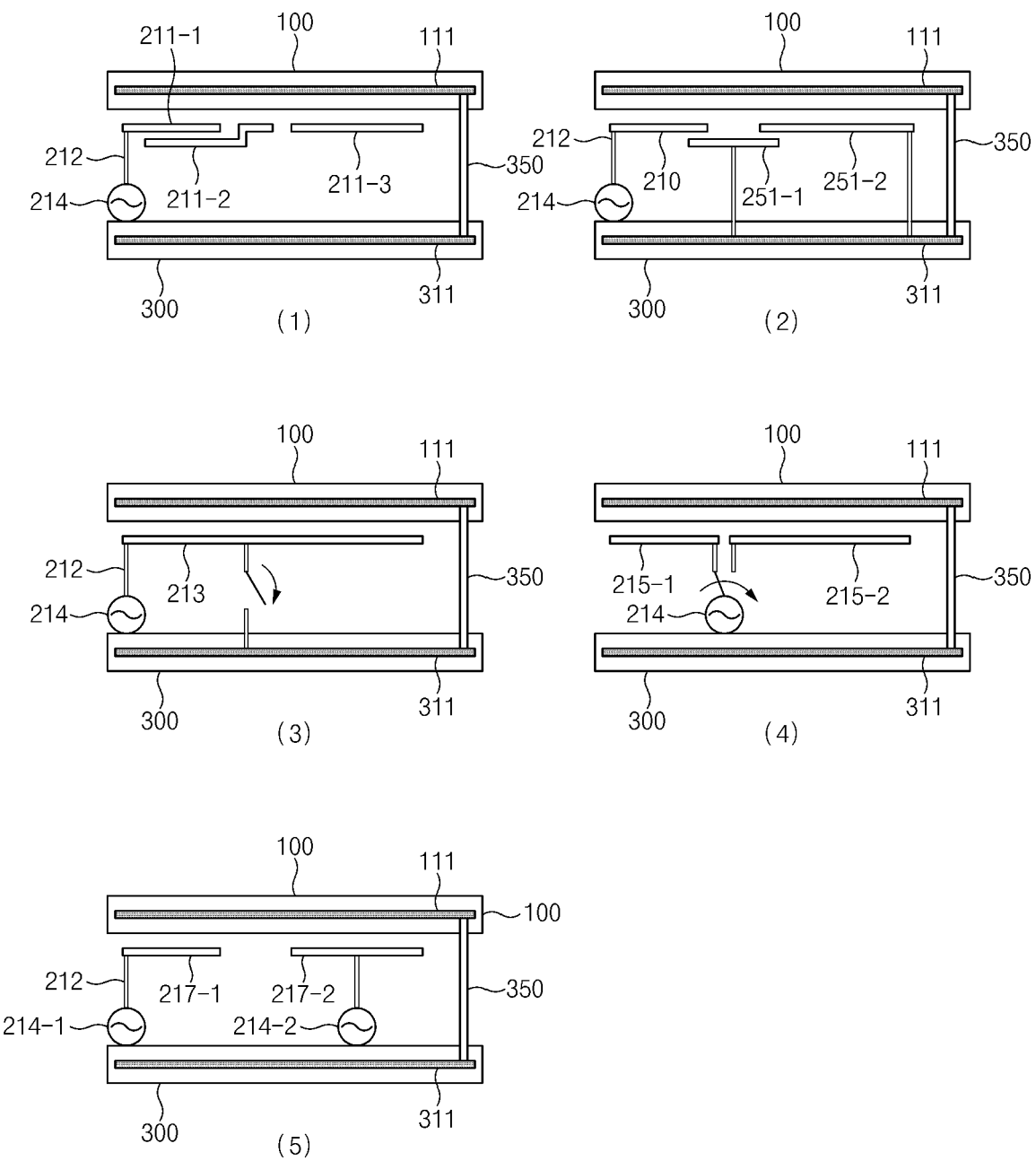
FIG. 10 illustrates a structure of an antenna according to various embodiments.

FIG. 10 illustrates a structure of the antenna 10 according to various embodiments.

Referring to FIG. 10, first to fifth configurations (1) to (5) are illustrated. The antenna 10 (e.g., the antenna 10 of FIG. 1) may have various configurations for target frequency bands, the number of target frequency bands, and antenna efficiency.

According to various embodiments, the first configuration (1) may include a first conductive pattern 211-1 (e.g., the first conductive pattern 210 in FIG. 2A) and additional floating patterns 211-2 and 211-3. The electrical length of the antenna signal formed through the coupling between the first conductive pattern 211-1 and the display 100 by the additional floating patterns 211-2 and 211-3 may be extended along the display 100. For example, the additional floating patterns 211-2 and 211-3 may be added depending on target frequency bands or the number of target frequency bands.

According to various embodiments, the second configuration (2) may include a plurality of second conductive patterns 251-1 and 251-2 electrically connected to a ground region (e.g., the second conductive pattern 250 of FIG. 2A). The electrical length of the antenna signal formed through the coupling between the first conductive pattern 211-1 and the display 100 may be changed by the plurality of second conductive patterns 251-1 and 251-2. The conductive pattern connected to the ground region may be added or subtracted depending on target frequency bands or the number of target frequency bands.

According to various embodiments, the third configuration (3) may include a switch electrically connected between a first conductive pattern 213 and the ground region of the printed circuit board 300. The electrical length of the first conductive pattern 213 may be adjusted depending on the operation of the switch. The electrical length of the antenna signal formed through the coupling between the first conductive pattern 213 and the display 100 may be changed depending on the operation of the switch.

According to various embodiments, the fourth configuration (4) may include a switch that selectively connects a plurality of first conductive patterns 215-1 and 215-2. For example, the shapes of the plurality of first conductive patterns 215-1 and 215-2 may be different from one another. For example, the transmitted/received frequency may be changed by selecting one of the first conductive patterns 215-1 and 215-2 having different electrical lengths depending on the operation of the switch.

According to various embodiments, the fifth configuration (5) may include a plurality of different conductive patterns 217-1 and 217-2, and each of the conductive patterns 217-1 and 217-2 may be fed. The first conductive pattern 217-1 and the second conductive pattern 217-2 may be referred to as radiators of different antennas, respectively. The display 100 may be coupled by the first conductive pattern 217-1 and the second conductive pattern 217-2. The antenna including the first conductive pattern 217-1 and the antenna including the second conductive pattern 217-2 may share the display 100 as a radiator.

Figure 11:
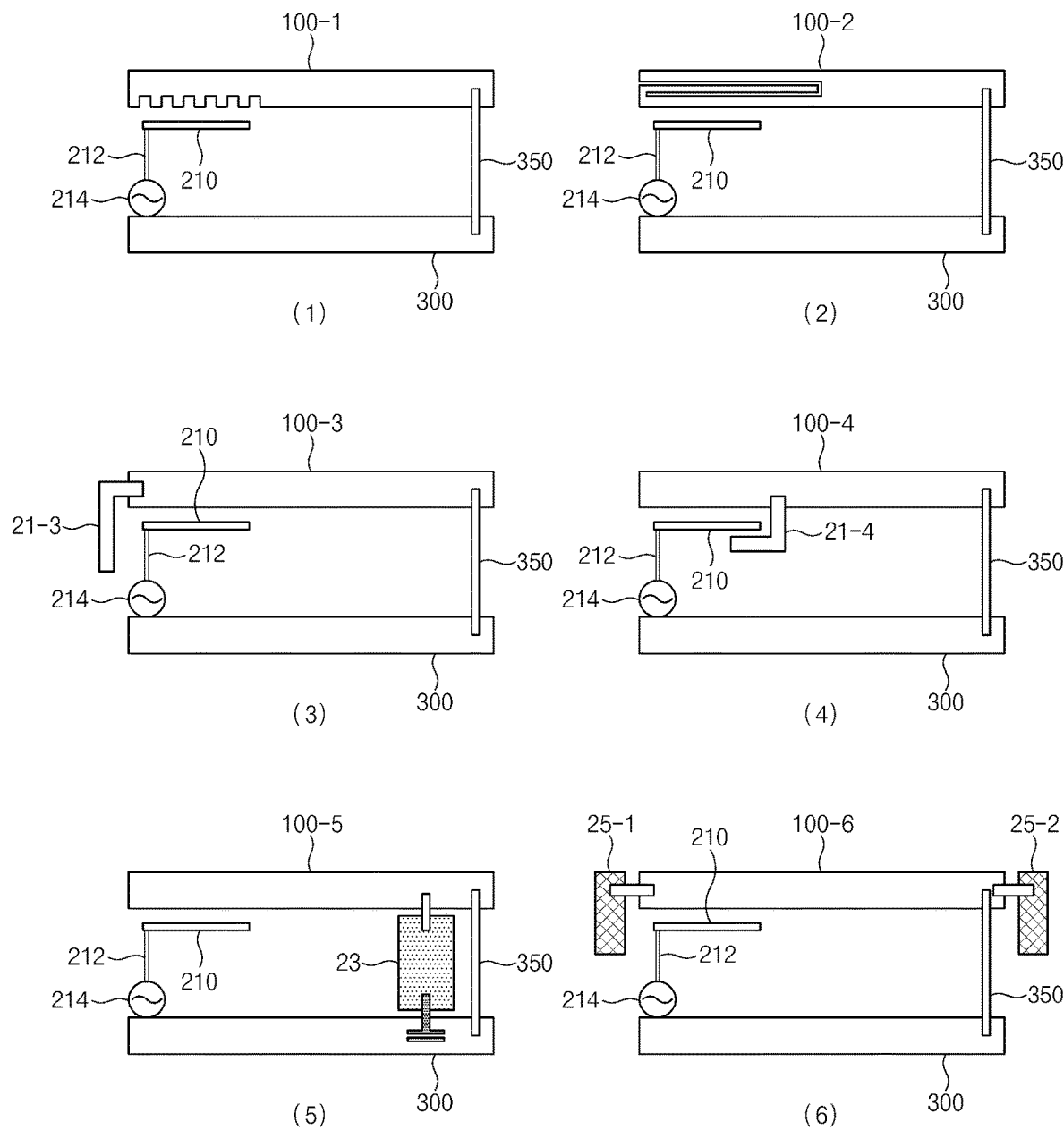
FIG. 11 illustrates a structure of a display included in an antenna according to various embodiments.

FIG. 11 illustrates a structure of a display (e.g., the display 100 of FIG. 2A) included in the antenna 10 according to various embodiments.

Referring to FIG. 11, structures of a display (e.g., the display 100 of FIG. 1A) according to various embodiments are illustrated. In the antenna 10 (e.g., the antenna 10 in FIG. 1A), at least part of the display may operate as a radiator. The length of the electrical path of the RF signal formed on the display may be adjusted based on at least one of the first to sixth antenna structures (1) to (6).

According to various embodiments, referring to a first display 100-1 of the first antenna structure (1) and a second display 110-2 of the second antenna structure (2), the length of the electrical path of the RF signal may be changed depending on the pattern of the conductive plate (e.g., the first conductive plate 111 in FIG. 1A) included in the first display 100-1 or the second display 100-2. For example, as illustrated in FIG. 11, the amount of coupling between the display 100 and the first conductive pattern 210 may be increased by the pattern of the conductive plate.

According to various embodiments, referring to a third display 100-3 of the third antenna structure (3) and a fourth display 110-4 of the fourth antenna structure (4), the conductive plate included in the third display 100-3 or the fourth display 100-4 may be extended by being coupled with conductive members 21-3 and 21-4. The length of the electrical path of the RF signal formed on the third display 100-3 or the fourth display 100-4 may be lengthened. For example, the electrical length of the conductive plate included in the third display 100-3 may be lengthened by the conductive member 21-3. The area of coupling with the first conductive pattern 210 may be increased by the conductive member 21-4 formed on the fourth display 100-4, and the electrical length of the conductive plate included in the fourth display 100-4 may be changed.

According to various embodiments, a fifth display 100-5 of the fifth antenna structure (5) may be electrically connected to a third conductive member 23 (e.g., electrical components or metallic components) embedded in an electronic device (e.g., the electronic device 20 in FIG. 2A). The electrical length of the conductive plate of the fifth display 100-5 may be lengthened by the third conductive member 23.

According to various embodiments, a sixth display 100-6 of the sixth antenna structure (6) may be electrically connected to metal housing (e.g., the housing in FIG. 2A) outside the antenna 10, or a fourth conductive member 25-1 or a fifth conductive member 25-2 such as decor. The electrical length of the conductive plate of the sixth display 100-6 may be lengthened by the fourth conductive member 25-1.

Figure 12:
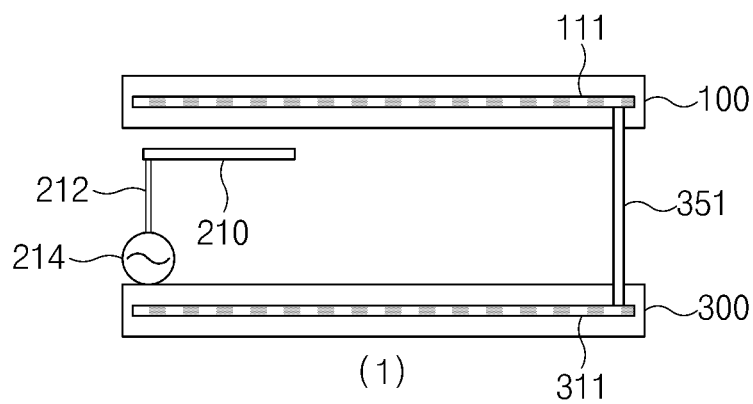
FIG. 12 illustrates a structure of a connection member included in an antenna according to various embodiments.
Figure 12:
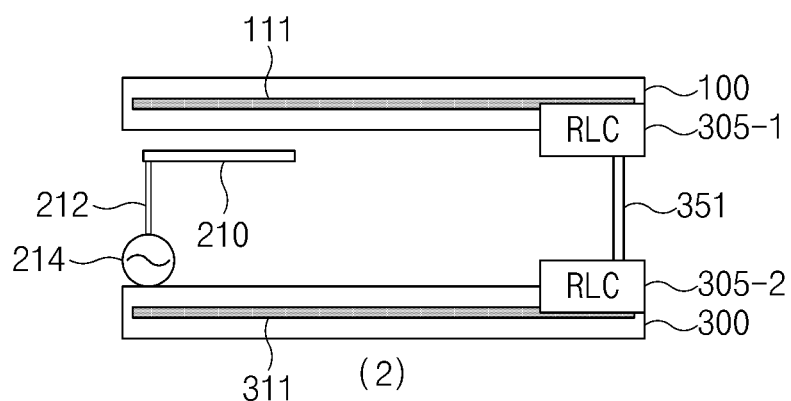
Figure 12:
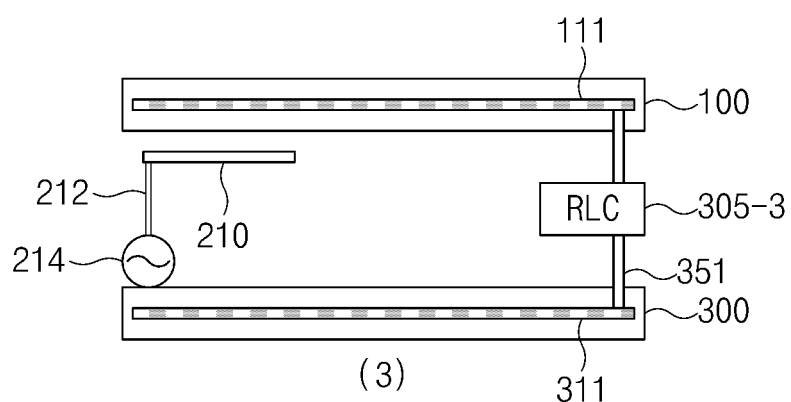

FIG. 12 illustrates a structure of a connection member 351 included in the antenna 10 according to various embodiments.

Referring to FIG. 12, structures of the connection member 351 (e.g., the connection member 350 of FIG. 3) according to various embodiments are illustrated. The connection member 351 may function as a shorting pin of a display (e.g., the display 100 of FIG. 1A). For another example, the connection member 351 may transmit a control signal or power associated with the display 100. For example, the connection member 351 may be referred to as a conductive connection member.

According to various embodiments, the connection member 351 of the antenna structure (1) may be integrally formed with the display 100 or the printed circuit board 300 (e.g., the printed circuit board 300 of FIG. 2A). For example, the conductive connection member 351 may be formed to extend from the first conductive plate 111 (e.g., the first conductive plate 111 of FIG. 1A) included in the display 100. For example, the conductive connection member 351 may be formed to extend from the second conductive plate 311 (e.g., the second conductive plate 311 of FIG. 1A) included in the printed circuit board 300.

In various embodiments, at least one of lumped elements 305-1, 305-2, and 305-3 may be positioned on the electrical path of the first conductive plate 111 and the second conductive plate 311 of the second antenna structure (2) or the third antenna structure (3). For example, in the second antenna structure (2), the first lumped element 305-1 or the second lumped element 305-2 may be positioned at both ends of the conductive connection member 351. For another example, in the third antenna structure (3), the third lumped element 305-3 may be disposed on the conductive connection member 351. The antenna characteristics may be changed depending on the lumped elements 305-1, 305-2, and 305-3. For example, the electrical length between the display 100, the connection member 351, and the printed circuit board 300 may be changed by the lumped elements 305-1, 305-2, and 305-3. The lumped elements 305-1, 305-2, and 305-3 may be used as tuning elements capable of adjusting a resonance frequency.

FIG. 13 is a block diagram illustrating an electronic device 1301 in a network environment 1300 according to various embodiments. Referring to FIG. 13, the electronic device 1301 in the network environment 1300 may communicate with an electronic device 1302 via a first network 1398 (e.g., a short-range wireless communication network), or an electronic device 1304 or a server 1308 via a second network 1399 (e.g., a long-range wireless communication network). According to an embodiment, the electronic device 1301 may communicate with the electronic device 1304 via the server 1308. According to an embodiment, the electronic device 1301 may include a processor 1320, memory 1330, an input device 1350, a sound output device 1355, a display device 1360, an audio module 1370, a sensor module 1376, an interface 1377, a haptic module 1379, a camera module 1380, a power management module 1388, a battery 1389, a communication module 1390, a subscriber identification module (SIM) 1396, or an antenna module 1397. In some embodiments, at least one (e.g., the display device 1360 or the camera module 1380) of the components may be omitted from the electronic device 1301, or one or more other components may be added in the electronic device 1301. In some embodiments, some of the components may be implemented as single integrated circuitry. For example, the sensor module 1376 (e.g., a fingerprint sensor, an iris sensor, or an illuminance sensor) may be implemented as embedded in the display device 1360 (e.g., a display).

The processor 1320 may execute, for example, software (e.g., a program 1340) to control at least one other component (e.g., a hardware or software component) of the electronic device 1301 coupled with the processor 1320, and may perform various data processing or computation. According to one embodiment, as at least part of the data processing or computation, the processor 1320 may load a command or data received from another component (e.g., the sensor module 1376 or the communication module 1390) in volatile memory 1332, process the command or the data stored in the volatile memory 1332, and store resulting data in non-volatile memory 1334. According to an embodiment, the processor 1320 may include a main processor 1321 (e.g., a central processing unit (CPU) or an application processor (AP)), and an auxiliary processor 1323 (e.g., a graphics processing unit (GPU), an image signal processor (ISP), a sensor hub processor, or a communication processor (CP)) that is operable independently from, or in conjunction with, the main processor 1321. Additionally or alternatively, the auxiliary processor 1323 may be adapted to consume less power than the main processor 1321, or to be specific to a specified function. The auxiliary processor 1323 may be implemented as separate from, or as part of the main processor 1321.

The auxiliary processor 1323 may control at least some of functions or states related to at least one component (e.g., the display device 1360, the sensor module 1376, or the communication module 1390) among the components of the electronic device 1301, instead of the main processor 1321 while the main processor 1321 is in an inactive (e.g., sleep) state, or together with the main processor 1321 while the main processor 1321 is in an active state (e.g., executing an application). According to an embodiment, the auxiliary processor 1323 (e.g., an image signal processor or a communication processor) may be implemented as part of another component (e.g., the camera module 1380 or the communication module 1390) functionally related to the auxiliary processor 1323.

The memory 1330 may store various data used by at least one component (e.g., the processor 1320 or the sensor module 1376) of the electronic device 1301. The various data may include, for example, software (e.g., the program 1340) and input data or output data for a command related thereto. The memory 1330 may include the volatile memory 1332 or the non-volatile memory 1334.

The program 1340 may be stored in the memory 1330 as software, and may include, for example, an operating system (OS) 1342, middleware 1344, or an application 1346.

The input device 1350 may receive a command or data to be used by other component (e.g., the processor 1320) of the electronic device 1301, from the outside (e.g., a user) of the electronic device 1301. The input device 1350 may include, for example, a microphone, a mouse, or a keyboard.

The sound output device 1355 may output sound signals to the outside of the electronic device 1301. The sound output device 1355 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 1360 may visually provide information to the outside (e.g., a user) of the electronic device 1301. The display device 1360 may include, for example, a display, a hologram device, or a projector and control circuitry to control a corresponding one of the display, hologram device, and projector. According to an embodiment, the display device 1360 may include touch circuitry adapted to detect a touch, or sensor circuitry (e.g., a pressure sensor) adapted to measure the intensity of force incurred by the touch.

The audio module 1370 may convert a sound into an electrical signal and vice versa. According to an embodiment, the audio module 1370 may obtain the sound via the input device 1350, or output the sound via the sound output device 1355 or a headphone of an external electronic device (e.g., an electronic device 1302) directly (e.g., wiredly) or wirelessly coupled with the electronic device 1301.

The sensor module 1376 may detect an operational state (e.g., power or temperature) of the electronic device 1301 or an environmental state (e.g., a state of a user) external to the electronic device 1301, and then generate an electrical signal or data value corresponding to the detected state. According to an embodiment, the sensor module 1376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1377 may support one or more specified protocols to be used for the electronic device 1301 to be coupled with the external electronic device (e.g., the electronic device 1302) directly (e.g., wiredly) or wirelessly. According to an embodiment, the interface 1377 may include, for example, a high definition multimedia interface (HDMI), a universal serial bus (USB) interface, a secure digital (SD) card interface, or an audio interface.

A connecting terminal 1378 may include a connector via which the electronic device 1301 may be physically connected with the external electronic device (e.g., the electronic device 1302). According to an embodiment, the connecting terminal 1378 may include, for example, a HDMI connector, a USB connector, a SD card connector, or an audio connector (e.g., a headphone connector), The haptic module 1379 may convert an electrical signal into a mechanical stimulus (e.g., a vibration or a movement) or electrical stimulus which may be recognized by a user via his tactile sensation or kinesthetic sensation. According to an embodiment, the haptic module 1379 may include, for example, a motor, a piezoelectric element, or an electric stimulator.

The camera module 1380 may capture a still image or moving images. According to an embodiment, the camera module 1380 may include one or more lenses, image sensors, image signal processors, or flashes.

The power management module 1388 may manage power supplied to the electronic device 1301. According to one embodiment, the power management module 1388 may be implemented as at least part of, for example, a power management integrated circuit (PMIC).

The battery 1389 may supply power to at least one component of the electronic device 1301. According to an embodiment, the battery 1389 may include, for example, a primary cell which is not rechargeable, a secondary cell which is rechargeable, or a fuel cell.

The communication module 1390 may support establishing a direct (e.g., wired) communication channel or a wireless communication channel between the electronic device 1301 and the external electronic device (e.g., the electronic device 1302, the electronic device 1304, or the server 1308) and performing communication via the established communication channel. The communication module 1390 may include one or more communication processors that are operable independently from the processor 1320 (e.g., the application processor (AP)) and supports a direct (e.g., wired) communication or a wireless communication. According to an embodiment, the communication module 1390 may include a wireless communication module 1392 (e.g., a cellular communication module, a short-range wireless communication module, or a global navigation satellite system (GNSS) communication module) or a wired communication module 1394 (e.g., a local area network (LAN) communication module or a power line communication (PLC) module). A corresponding one of these communication modules may communicate with the external electronic device via the first network 1398 (e.g., a short-range communication network, such as Bluetooth™, wireless-fidelity (Wi-Fi) direct, or infrared data association (IrDA)) or the second network 1399 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1392 may identify and authenticate the electronic device 1301 in a communication network, such as the first network 1398 or the second network 1399, using subscriber information (e.g., international mobile subscriber identity (IMSI)) stored in the subscriber identification module 1396.

The antenna module 1397 may transmit or receive a signal or power to or from the outside (e.g., the external electronic device) of the electronic device 1301. According to an embodiment, the antenna module 1397 may include one or more antennas, and, therefrom, at least one antenna appropriate for a communication scheme used in the communication network, such as the first network 1398 or the second network 1399, may be selected, for example, by the communication module 1390 (e.g., the wireless communication module 1392). The signal or the power may then be transmitted or received between the communication module 1390 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1301 and the external electronic device 1304 via the server 1308 coupled with the second network 1399. Each of the electronic devices 1302 and 1304 may be a device of a same type as, or a different type, from the electronic device 1301. According to an embodiment, all or some of operations to be executed at the electronic device 1301 may be executed at one or more of the external electronic devices 1302, 1304, or 1308. For example, if the electronic device 1301 should perform a function or a service automatically, or in response to a request from a user or another device, the electronic device 1301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1301. The electronic device 1301 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

According to an embodiment of the disclosure, an electronic device (e.g., the electronic device 20 of FIG. 2A) may include a housing (e.g., the housing 130 of FIG. 2B) including a first surface (e.g., the first surface 130a of FIG. 2B), a second surface (e.g., the second surface 130c of FIG. 2B) facing away from the first surface, and a side surface (e.g., the side surface 130b of FIG. 2B) surrounding a space between the first surface and the second surface, a display (e.g., the display 100 of FIG. 1A) exposed through a part of the first surface and including a first conductive plate (e.g., the first conductive plate 111 of FIG. 1A), a printed circuit board (e.g., the printed circuit board 300 of FIG. 1A) including a second conductive plate (e.g., the second conductive plate 311 of FIG. 1A) interposed between the display and the second surface within the housing and electrically connected to the first conductive plate, a first conductive pattern (e.g., the first conductive pattern 210 of FIG. 1A) interposed between the display and the printed circuit board, a second conductive pattern (e.g., the second conductive pattern 250 of FIG. 1A) interposed between the display and the printed circuit board to be adjacent to the first conductive pattern and electrically connected to the second conductive plate, a wireless communication circuit electrically connected to the first conductive pattern and transmitting or receiving an RF signal of a first frequency or an RF signal of a second frequency, and at least one processor (e.g., the processor 1320 of FIG. 13) electrically connected to the wireless communication circuit.

According to an embodiment, the wireless communication circuit may be configured to transmit and receive the RF signal of the first frequency and the RF signal of the second frequency, based on coupling between the first conductive pattern (e.g., the first conductive pattern 210 of FIG. 1A) and at least part of the first conductive plate (e.g., the first conductive plate 111 of FIG. 1A) and coupling between the second conductive pattern (e.g., the second conductive pattern 250 of FIG. 1A) and at least part of the first conductive plate.

According to an embodiment, the wireless communication circuit is configured to feed one point of the first conductive pattern (e.g., the first conductive pattern 210 of FIG. 1A).

According to an embodiment, the electronic device may further include a support member (e.g., the support member 320 of FIG. 2A) interposed between the display and the printed circuit board. The first conductive pattern or the second conductive pattern may be disposed on the support member.

According to an embodiment, the electronic device may further include a battery (e.g., the battery 310 of FIG. 2A) interposed between the printed circuit board and the support member and disposed to overlap with at least part of the first conductive pattern or at least part of the second conductive pattern.

According to an embodiment, at least one of the first conductive pattern or the second conductive pattern of the electronic device may be a laser direct structuring (LDS) pattern formed on the support member.

According to an embodiment, the display (e.g., the display 100 of FIG. 1A) may include a first side, a second side extending in a direction perpendicular to the first side, a third side extending in parallel with the first side from the second side, and a fourth side extending in parallel with the second side from the third side. The first conductive pattern may be disposed adjacent to the first side, and the second conductive pattern is disposed adjacent to the third side.

According to an embodiment, the electronic device may further include a conductive connection member (e.g., the conductive connection member 350 of FIG. 1A) electrically connecting the first conductive plate to the second conductive plate. According to an embodiment, the conductive connection member may be formed to extend from the first conductive plate or the second conductive plate.

According to an embodiment, the wireless communication circuit may be configured to receive the RF signal of the first frequency and the RF signal of the second frequency that correspond to a size of the first conductive plate (e.g., the first conductive plate 111 of FIG. 1A). For example, the first frequency may include 1.5 GHz band, and the second frequency may include 2.4 GHz band.

According to an embodiment, the wireless communication circuit may be configured to receive the RF signal of the second frequency based on coupling between at least part of the first conductive pattern and at least part of the second conductive pattern.

According to an embodiment, the first conductive plate may include at least one of a touch screen panel (TSP) layer or a thin film transistor (TFT) layer, which is a shielding layer.

According to an embodiment, at least part of the second surface (e.g., the second surface 130c of FIG. 2B) of the housing (e.g., the housing 130 of FIG. 2B) may be contacted by a user's body.

Furthermore, according to an embodiment disclosed in this specification, an electronic device (e.g., the electronic device 20 of FIG. 2A) may include a housing (e.g., the housing 130 of FIG. 2B) including a first surface (e.g., the first surface 130a of FIG. 2B) facing in a first direction and a second surface (e.g., the second surface 130c of FIG. 2B) facing in a second direction opposite to the first direction, a display (e.g., the display 100 of FIG. 1A) disposed inside the housing and viewable through at least part of the first surface, a printed circuit board (e.g., the printed circuit board 300 of FIG. 1A) interposed between the display and the second surface inside the housing and including a second conductive plate (e.g., the second conductive plate 311 of FIG. 1A), a conductive pattern (e.g., the first conductive pattern 210 of FIG. 1A) positioned between the display and the printed circuit board, spaced from the first conductive plate, and positioned in a first region (e.g., the first region 50 of FIG. 2A) when viewed from above the display, a wireless communication circuit mounted on the printed circuit board, and electrically connected to the conductive pattern, and an electrical path connected between a first point (e.g., the first point 31 of FIG. 2A) of the first conductive plate and a second point (e.g., the second point 33 of FIG. 2A) of the second conductive plate. The display may include a first conductive plate (e.g., the first conductive plate 111 of FIG. 1A). The first point and the second point may be in a second region (e.g., the second region 55 of FIG. 2A) outside the first region when viewed from above the display.

In an embodiment, the conductive pattern may be parallel to the first conductive plate. The conductive pattern (e.g., the first conductive pattern 210 of FIG. 1A) may be closer to the first conductive plate than the second conductive plate.

According to an embodiment, the display may include a first edge (e.g., the first edge 100a of FIG. 2A) and a second edge (e.g., the second edge 100b of FIG. 2A) parallel to the first edge. The first region (e.g., the first region 50 of FIG. 2A) may be closer to the first edge than the second edge, and the second region (e.g., the second region 55 of FIG. 2A) may be closer to the second edge than the first edge.

According to an embodiment, the wireless communication circuit may be configured to transmit and/or receive a signal having a frequency between 1.5 GHz and 2.4 GHz.

According to an embodiment, the wireless communication circuit may be configured to transmit and receive the signal based on coupling between the conductive pattern and at least part of the first conductive plate.

Various embodiments as set forth herein may be implemented as software (e.g., the program 1340) including one or more instructions that are stored in a storage medium (e.g., internal memory 1336 or external memory 1338) that is readable by a machine (e.g., the electronic device 1301). For example, a processor (e.g., the processor 1320) of the machine (e.g., the electronic device 1301) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

The invention claimed is:

1. An electronic device comprising:
   a housing including a first surface, a second surface facing away from the first surface, and a side surface surrounding a space between the first surface and the second surface;
   a display exposed through a part of the first surface and including a first conductive plate;
   a printed circuit board interposed between the display and the second surface within the housing, the printed circuit board including a second conductive plate electrically connected to the first conductive plate;
   a first conductive pattern interposed between the display and the printed circuit board;
   a second conductive pattern interposed between the display and the printed circuit board to be adjacent to the first conductive pattern and electrically connected to the second conductive plate;
   a wireless communication circuit electrically connected to the first conductive pattern and configured to transmit or receive an RF (radio frequency) signal of a first frequency and an RF signal of a second frequency; and
   at least one processor electrically connected to the wireless communication circuit;
   wherein the first conductive plate is configured to radiate the RF signal of the first frequency and the RF signal of the second frequency.

2. The electronic device of claim 1, wherein the wireless communication circuit is configured to:
   transmit and receive the RF signal of the first frequency and the RF signal of the second frequency, based on coupling between the first conductive pattern and at least part of the first conductive plate and coupling between the second conductive pattern and at least part of the first conductive plate.

3. The electronic device of claim 1, wherein the wireless communication circuit is configured to:
   feed one point of the first conductive pattern.

4. The electronic device of claim 3, further comprising:
   a support member interposed between the display and the printed circuit board,
   wherein the first conductive pattern or the second conductive pattern are disposed on the support member.

5. The electronic device of claim 4, further comprising:
   a battery interposed between the printed circuit board and the support member and disposed to overlap with at least part of the first conductive pattern or at least part of the second conductive pattern.

6. The electronic device of claim 4, wherein at least one of the first conductive pattern or the second conductive pattern is a laser direct structuring (LDS) pattern formed on the support member.

7. The electronic device of claim 1, wherein the display includes a first side, a second side extending in a direction perpendicular to the first side, a third side extending in parallel with the first side from the second side, and a fourth side extending in parallel with the second side from the third side, and
   wherein the first conductive pattern is disposed adjacent to the first side, and the second conductive pattern is disposed adjacent to the third side.

8. The electronic device of claim 1, further comprising:
   a conductive connection member electrically connecting the first conductive plate to the second conductive plate.

9. The electronic device of claim 8, wherein the conductive connection member is formed to extend from the first conductive plate or the second conductive plate.

10. The electronic device of claim 1, wherein the wireless communication circuit is configured to:
    receive the RF signal of the first frequency and the RF signal of the second frequency that correspond to a size of the first conductive plate.

11. The electronic device of claim 1, wherein the first conductive plate includes at least one of a touch screen panel (TSP) layer or a thin film transistor (TFT) layer, which is a shielding layer.

12. The electronic device of claim 1, wherein at least part of the second surface is contacted by a user's body.

13. The electronic device of claim 1, wherein the first frequency includes 1.5 GHz band, and the second frequency includes 2.4 GHz band.

14. The electronic device of claim 13, wherein the wireless communication circuit is configured to:
    receive the RF signal of the second frequency based on coupling between at least part of the first conductive pattern and at least part of the second conductive pattern.

15. An electronic device comprising:
    a housing including a first surface facing in a first direction and a second surface facing in a second direction opposite to the first direction;
    a display disposed inside the housing and viewable through at least part of the first surface, wherein the display includes a first conductive plate;
    a printed circuit board interposed between the display and the second surface inside the housing and including a second conductive plate;
    a conductive pattern positioned between the display and the printed circuit board, spaced from the first conductive plate, and positioned in a first region when viewed from above the display;
    a wireless communication circuit mounted on the printed circuit board, and electrically connected to the conductive pattern; and
    an electrical path connected between a first point of the first conductive plate and a second point of the second conductive plate,
    wherein the first point and the second point are in a second region outside the first region when viewed from above the display.

* * * * *